US005886560A

United States Patent [19]

Kimura

[11] Patent Number: 5,886,560

[45] Date of Patent: *Mar. 23, 1999

[54] ANALOG MULTIPLIER OPERABLE ON A LOW SUPPLY VOLTAGE

[75] Inventor: Katsuji Kimura, Tokyo, Japan

[73] Assignee: NEC Corporation, Tokyo, Japan

[ * ] Notice: The term of this patent shall not extend beyond the expiration date of Pat. No. 5,576,653.

[21] Appl. No.: 917,689

[22] Filed: Aug. 26, 1997

Related U.S. Application Data

[63] Continuation of Ser. No. 665,918, Jun. 19, 1996, abandoned, which is a continuation of Ser. No. 458,008, Jun. 1, 1995, Pat. No. 5,576,653, which is a continuation of Ser. No. 162,261, Dec. 7, 1993, abandoned.

[30] Foreign Application Priority Data

Dec. 8, 1992 [JP] Japan .................................... 4-328258

[51] Int. Cl.[6] ................................ G06G 7/16; H03K 5/22

[52] U.S. Cl. .......................... 327/359; 327/113; 327/355; 327/357; 327/356; 327/560; 327/563; 455/333

[58] Field of Search .................................... 327/116, 100, 327/113, 355, 356, 114, 103, 359; 455/326, 333

[56] References Cited

U.S. PATENT DOCUMENTS

| | | | |
|---|---|---|---|
| 4,546,275 | 10/1985 | Pena-Lenol et al. | 327/355 |
| 4,990,803 | 2/1991 | Gilbert | 327/351 |
| 5,057,716 | 10/1991 | Küng | 327/358 |
| 5,107,150 | 4/1992 | Kimura | 327/349 |
| 5,157,350 | 10/1992 | Rubens | 330/254 |
| 5,187,682 | 2/1993 | Kimura | 364/841 |
| 5,311,086 | 5/1994 | Yamaji et al. | 327/356 |
| 5,319,267 | 6/1994 | Kimura | 327/122 |
| 5,329,173 | 7/1994 | Murakami et al. | 327/63 |
| 5,331,289 | 7/1994 | Price | 330/252 |
| 5,438,296 | 8/1995 | Kimura | 327/560 |
| 5,523,717 | 6/1996 | Kimura | 330/252 |
| 5,552,734 | 9/1996 | Kimura | 327/356 |
| 5,576,653 | 11/1996 | Kimura | 327/356 |
| 5,578,965 | 11/1996 | Kimura | 330/254 |
| 5,581,210 | 12/1996 | Kimura | 327/355 |

OTHER PUBLICATIONS

Zhenhua Wang, "A CMOS Four Quadrant Analog Multiplier with Single Ended Voltgae Output and Improved Temperature Performance", IEEE Journal of Solid State Circuits, No. 9, pp. 1293–1301, Sep. 1991.

Patent Abstracts of Japan, Abstract of JP–A 3–033989.

K. Kimura, "A Unified Analysis of Four–Quadrant Multipliers Consisting of Emitter and on Low Supply Voltage," IEICE Transactions on Electronics, vol. E76–C, No. 5, May 1993, pp. 714–737.

K. Kimura, "A Bipolar Very Low–Voltage Multiplier Core Using a Quadritail Cell," IEICE Trans. Fundamentals, vol. E78–A, No. 5 May 1995, pp. 560–565.

*Primary Examiner*—Dinh Le

*Attorney, Agent, or Firm*—Sughrue, Mion, Zinn, Macpeak & Seas, PLLC

[57] ABSTRACT

A multiplier includes first through fourth transistors ($Q_1$, $Q_2$, $Q_3$, $Q_4$) and a current source ($I_0$) The first transistor has a base electrode connected to a first input terminal (T1) and a collector electrode connected to a first output terminal (T5). The second transistor has a base electrode connected to a second input terminal (T2) and a collector electrode connected to a second output terminal (T6). The third transistor has a base electrode connected to a third input terminal (T3) and a collector electrode connected to the second output terminal. The fourth transistor has a base electrode connected to a fourth input terminal (T4) and a collector electrode connected to the first output terminal. Supplied with voltages of $V_1$ and $V_2$, a voltage supplying circuit produces and supplies voltages of (½)$V_1$, (−½)$V_1$, {(½)$V_1$−$V_2$}, and {(−½)$V_1$−$V_2$} to the input terminals. The output terminals are supplied with first and second output currents.

5 Claims, 4 Drawing Sheets

ANALOG MULTIPLIER OPERABLE ON A LOW SUPPLY VOLTAGE

This is a Continuation of application Ser. No. 08/665,918 filed Jun. 19, 1996, now abandoned, which is a continuation of prior application Ser. No. 08/458,008 filed Jun. 1, 1995, U.S. Pat. No. 5,576,653 which is a continuation of prior application Ser. No. 08/162,261 filed Dec. 7, 1993, now abandoned.

BACKGROUND OF THE INVENTION:

The present invention relates to an analog multiplier for receiving primary and secondary input analog signals to produce a product of the two input analog signals as an output signal.

In the manner which will later be described more in detail, a conventional analog multiplier comprises a first stage circuit, a second stage circuit, and a current source. The first stage circuit comprises a primary pair of first and second transistors and a secondary pair of third and fourth transistors. The second stage circuit comprises a ternary pair of fifth and sixth transistors.

The primary analog input signal has a primary voltage. The secondary analog input signal has a secondary voltage. The first stage circuit is supplied with the primary voltage. The second stage circuit is supplied with the secondary voltage. As a result, this conventional analog multiplier comprises the first and the second stage circuits which are directly connected to each other. Consequently, this conventional analog multiplier is not operable on a low supply voltage.

SUMMARY OF THE INVENTION:

It is therefore an object of the present invention to provide an analog multiplier which is operable on a low supply voltage.

Other objects of this invention will become clear as the description proceeds.

According to an aspect of this invention, there is provided an analog multiplier which comprises (A) a primary pair of first and second transistors, the first transistor having a base electrode connected to a first input terminal and a collector electrode connected to a first output terminal, the second transistor having a base electrode connected to a second input terminal and a collector electrode connected to a second output terminal; (B) a secondary pair of third and fourth transistors, the third transistor having a base electrode connected to a third input terminal and a collector electrode connected to the second output terminal, the fourth transistor having a base electrode connected to a fourth input terminal and a collector electrode connected to the first output terminal; and (C) a current source connected to emitter electrodes of the first through the fourth transistors.

According to another aspect of this invention, there is provided an analog multiplier which receives a primary input analog signal having a primary voltage of $V_1$ and a secondary input analog signal having a secondary voltage of $V_2$ to produce a primary output current and a secondary output current. The analog multiplier comprises (A) a primary pair of first and second transistors, the first transistor having a base electrode connected to a first input terminal and a collector electrode connected to a first output terminal supplied with the primary output current, the second transistor having a base electrode connected to a second input terminal and a collector electrode connected to a second output terminal supplied with the secondary output current; (B) a secondary pair of third and fourth transistors, the third transistor having a base electrode connected to a third input terminal and a collector electrode connected to the second output terminal, the fourth transistor having a base electrode connected to a fourth input terminal and a collector electrode connected to the first output terminal; (C) a current source connected to emitter electrodes of the first through the fourth transistors; and (D) a voltage supplying circuit connected to the first through the fourth input terminals for producing, in response to the primary and the secondary voltages of $V_1$ and $V_2$, a first voltage of $(\frac{1}{2})V_1$, a second voltage of $(-\frac{1}{2})V_1$, a third voltage of $\{(\frac{1}{2})V_1-V_2\}$, and a fourth voltage of $\{(-\frac{1}{2})V_1-V_2\}$ to supply the first through the fourth voltages of $(\frac{1}{2})V_1$, $(-\frac{1}{2})V_1$, $\{(-\frac{1}{2})V_1-V_2\}$, and $\{(-\frac{1}{2})V_1-V_2\}$ to the first through the fourth input terminals, respectively.

Figure 1:
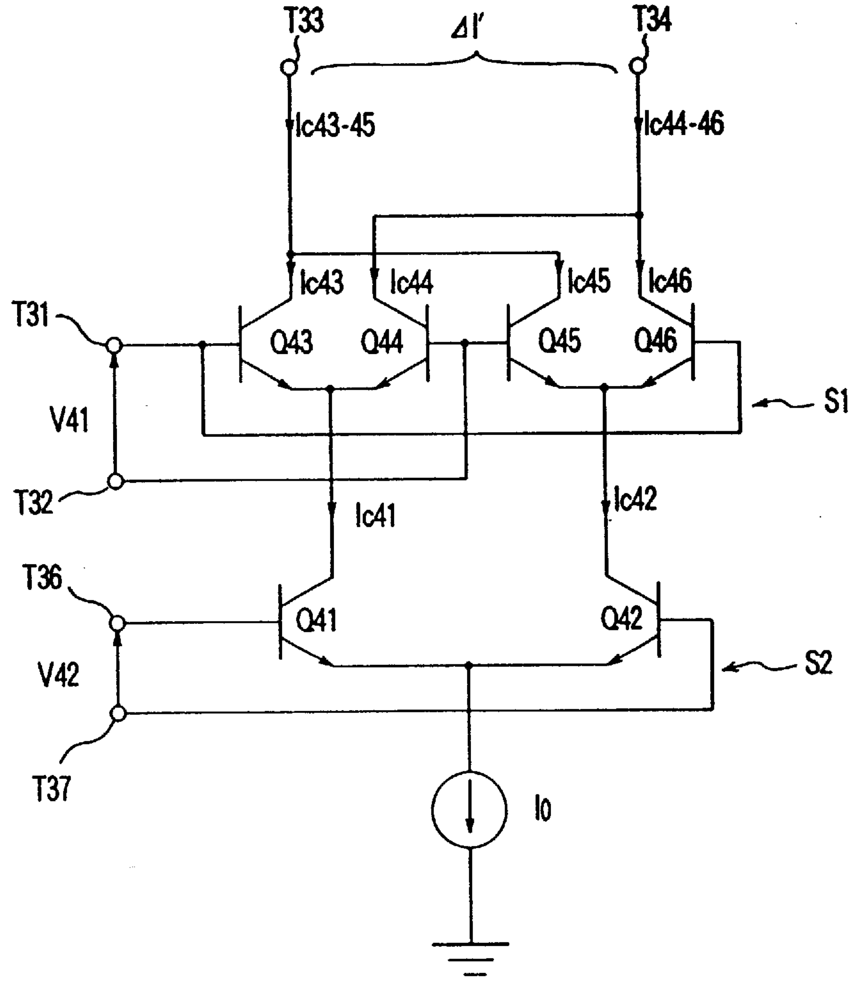
F I G. 1 (PRIOR ART)
FIG. 1 is a circuit diagram of a conventional analog multiplier.

DESCRIPTION OF THE PREFERRED EMBODIMENTS:

Referring to FIG. 1, a conventional analog multiplier will be described for a better understanding of this invention. The conventional analog multiplier comprises a first stage circuit S1, a second stage circuit S2, and a current source $I_0$ with a current of $I_0$. The first stage circuit S1 comprises a primary pair of transistors Q43 and Q44 and a secondary pair of transistors Q45 and Q46.

The transistor Q43 has a base electrode connected to an input terminal T31 and a collector electrode connected to a primary output terminal T33. The transistor Q44 has a base electrode connected to an input terminal T32 and a collector electrode connected to a secondary output terminal T34. The transistor Q45 has a base electrode connected to the input terminal T32 and a collector electrode connected to the primary output terminal T33. The transistor Q46 has a base electrode connected to the input terminal T31 and a collector electrode connected to the secondary output terminal T34.

The second stage circuit S2 comprises a ternary pair of transistors Q41 and Q42. The transistor Q41 has a base electrode connected to an input terminal T36 and a collector electrode connected to emitter electrodes of the transistors Q43 and Q44. The transistor 42 has a base electrode connected to an input terminal T37 and a collector electrode connected to the transistors Q45 and Q46. The current source $I_0$ is connected to emitter electrodes of the transistors Q41 and Q42.

The first stage circuit S1 is supplied with a first input analog signal having a voltage of $V_{41}$. More specifically, the input terminals T31 and T32 are supplied with the voltage of $V_{41}$. The second stage circuit S2 is supplied with a second input analog signal having a voltage of $V_{42}$. More specifically, the input terminals T36 and T37 are supplied with the voltage of $V_{42}$.

When the analog multiplier is supplied with the first and the second input analog signal, the primary output terminal T33 is supplied with a first output current of $I_{C43-45}$. Also, the secondary output terminal T34 is supplied with a second output current of $I_{C44-46}$. The collector electrode of the transistor Q43 is supplied with a current of $I_{C43}$. The collector electrode of the transistor Q44 is supplied with a current of $I_{C44}$. The collector electrode of the transistor Q45 is supplied with a current of $I_{C45}$. The collector electrode of the transistor Q46 is supplied with a current of $I_{C46}$. The collector electrode of the transistor Q41 is supplied with a current of $I_{C41}$. The collector electrode of the transistor Q42 is supplied with a current of $I_{C42}$.

In FIG. 1, it will be assumed that each of emitter currents in the transistors Q41 to Q46 is represented by $I_E$ the $I_E$ is defined by a following equation (1).

$$I_E = I_S\left\{\exp\left(\frac{qV_{BE}}{kT}\right) - 1\right\} \tag{1}$$

In Equation (1), $I_S$ represents a saturation current, k represents Boltzmann's constant, q represents a unit electric charge, $V_{BE}$ represents a voltage between the base electrode and the emitter electrode in each of transistors Q41 to Q46, and T represents an absolute temperature.

In Equation (1), it will be assumed that $V_T$ is equal to kT/q. In this event, $\exp(V_{BE}/V_T)$ is greater than "1". Consequently, Equation (1) is rewritten into:

$$I_E \approx I_S \exp(V_{BE}/V_T) \tag{2}$$

In this event, $I_{C43}$, $I_{C44}$, $I_{C45}$, $I_{C46}$, $I_{C41}$, and $I_{C42}$ are represented by following equations (3), (4), (5), (6), (7), and (8), respectively.

$$I_{C43} = \frac{\alpha_F I_{C41}}{1 + \exp(-V_{41}/V_T)} \tag{3}$$

$$I_{C44} = \frac{\alpha_F I_{C41}}{1 + \exp(V_{41}/V_T)} \tag{4}$$

$$I_{C45} = \frac{\alpha_F I_{C42}}{1 + \exp(V_{41}/V_T)} \tag{5}$$

$$I_{C46} = \frac{\alpha_F I_{C42}}{1 + \exp(-V_{41}/V_T)} \tag{6}$$

$$I_{C41} = \frac{\alpha_F I_0}{1 + \exp(-V_{42}/V_T)} \tag{7}$$

$$I_{C42} = \frac{\alpha_F I_0}{1 + \exp(V_{42}/V_T)} \tag{8}$$

In Equations (3) to (8), $\alpha_F$ represents a DC common-base current gain factor in each of the transistors Q41 to Q46.

The $I_{C43}$, the $I_{C44}$, the $I_{C45}$, and the $I_{C46}$ are rewritten by following equations (9), (10), (11), and (12) by substituting Equations (7) and (8) for the $I_{C41}$ and the $I_{C42}$ in Equations (3) to (6).

$$I_{C43} = \frac{\alpha_F^2 I_0}{\{1 + \exp(-V_{41}/V_T)\}\{1 + \exp(-V_{42}/V_T)\}} \tag{9}$$

$$I_{C44} = \frac{\alpha_F^2 I_0}{\{1 + \exp(V_{41}/V_T)\}\{1 + \exp(-V_{42}/V_T)\}} \tag{10}$$

$$I_{C45} = \frac{\alpha_F^2 I_0}{\{1 + \exp(V_{41}/V_T)\}\{1 + \exp(V_{42}/V_T)\}} \tag{11}$$

$$I_{C46} = \frac{\alpha_F^2 I_0}{\{1 + \exp(-V_{41}/V_T)\}\{1 + \exp(V_{42}/V_T)\}} \tag{12}$$

Consequently, a difference current of ΔI' between $I_{C43-45}$ and $I_{C44-46}$ is represented by a following equation (13).

$$\begin{aligned} \Delta I' &= I_{C43-45} - I_{C44-46} \\ &= (I_{C43} + I_{C45}) - (I_{C44} + I_{C46}) \\ &= (I_{C43} - I_{C46}) - (I_{C44} - I_{C45}) \\ &= \alpha_F^2 \cdot I_0 \cdot \tanh\{V_{41}/(2V_T)\} \cdot \tanh\{V_{42}/(2V_T)\} \end{aligned} \tag{13}$$

In Equation (13), it will be assumed that each of $V_{41}$ and $V_{42}$ is smaller than $2V_T$. In this event, Equation (13) is rewritten into:

$$\Delta I' \approx (1/4)(\alpha_F/V_T)^2 V_{41} \cdot V_{42} \tag{14}$$

This conventional analog multiplier comprises the first and the second stage circuits S1 and S2 which are supplied with the voltages of $V_{41}$ and $V_{42}$. As a result, this conventional analog multiplier is supplied with a product of the voltages of $V_{41}$ and $V_{42}$. Consequently, this conventional analog multiplier is not operable on a low supply voltage.

Figure 2:
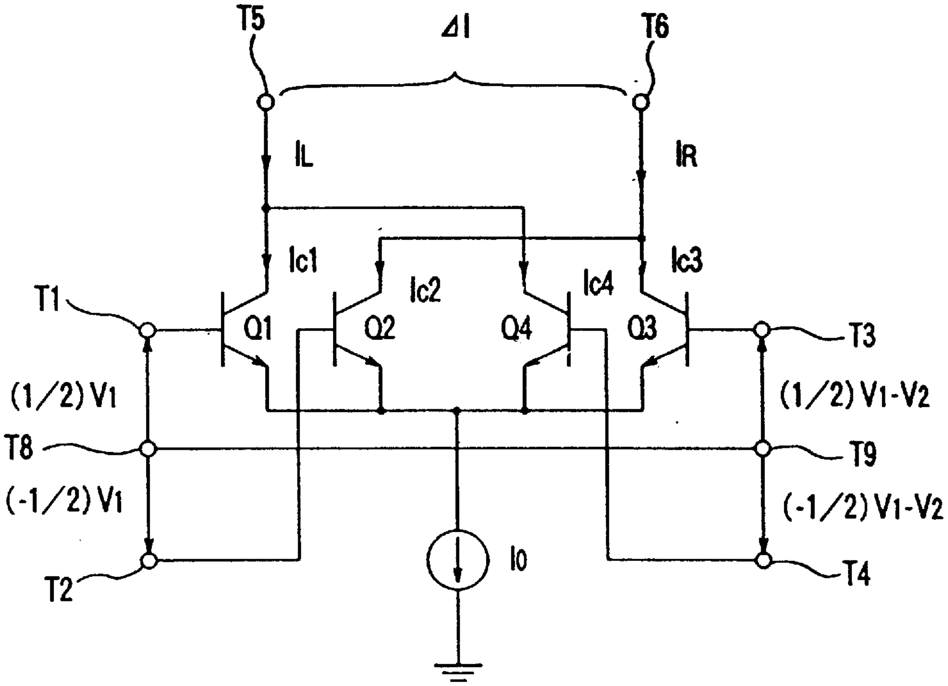
FIG. 2 is a circuit diagram of an analog multiplier according to a first embodiment of this invention.

Referring to FIG. 2, the description will proceed to an analog multiplier according to a first embodiment of this invention. Similar parts are designated by like reference numerals.

The analog multiplier comprises a first pair of transistors Q1 and Q2, a second pair of transistors Q3 and Q4, and the current source $I_0$. The transistor Q1 has a base electrode connected to an input terminal T1 and a collector electrode connected to an output terminal T5. The transistor Q2 has a base electrode connected to an input terminal T2 and a collector electrode connected to an output terminal T6.

The transistor Q3 has a base electrode connected to an output terminal T3 and a collector electrode connected to the output terminal T6. The transistor Q4 has a base electrode connected to an input terminal T4 and a collector electrode connected to the output terminal T5. The current source $I_0$ is connected to emitter electrodes of the transistors $Q_1$, $Q_2$, $Q_3$, and $Q_4$. The analog multiplier has two reference terminals T8 and T9 each of which has a reference voltage of zero level.

A voltage of (½)$V_1$ is applied between the input terminal T1 and the reference terminal T8. Namely, the input terminal T1 is supplied with the voltage of (½)$V_1$. A voltage of (−½)$V_1$ is applied between the input terminal T2 and the reference terminal T8. Namely, the input terminal T2 is supplied with the voltage of (−½)$V_1$. A voltage of {(½)$V_1$−$V_2$} is applied between the input terminal T3 and the reference terminal T9. Namely, the input terminal T3 is supplied with the voltage of {(½)$V_1$−$V_2$}. A voltage of {(−½)$V_1$−$V_2$} is applied between the input terminal T4 and the reference terminal T9. Namely, the input terminal T4 is supplied with the voltage of {(−½)$V_1$−$V_2$}.

When the input terminals T1, T2, T3, and T4 are supplied with the voltages of (½)$V_1$, (−½)$V_1$, {(½)$V_1$−$V_2$}, and {(−½)$V_1$−$V_2$} the output terminals T5 and T6 are supplied with output currents of $I_L$ and $I_R$ respectively.

In FIG. 2, collector currents of $I_{C1}$, $I_{C2}$, $I_{C3}$, and $I_{C4}$ in the transistors $Q_1$, $Q_2$, $Q_3$ and $Q_4$ are represented by following equations (15), (16), (17), and (18).

$$I_{C1} = I_S \exp\left\{\frac{V_{BE} + (1/2)V_1}{V_T}\right\} \tag{15}$$

$$I_{C2} = I_S \exp\left\{\frac{V_{BE} - (1/2)V_1}{V_T}\right\} \tag{16}$$

$$I_{C3} = I_S \exp\left\{\frac{V_{BE} + (1/2)V_1 - V_2}{V_T}\right\} \tag{17}$$

-continued $$I_{C4}=I_S\exp\left\{\frac{V_{BE}-(1/2)V_1-V_2}{V_T}\right\} \quad (18)$$

In FIG. 2, inasmuch as the transistors Q1, Q2, Q3, and Q4 are driven by the current source $I_0$, a relation of the $I_{C1}$, $I_{C2}$, $I_{C3}$, $I_{C4}$, and $I_0$ is given by a following equation (19).

$$I_{C1}+I_{C2}+I_{C3}+I_{C4}=\alpha_F I_0 \quad (19)$$

A following equation (20) is given by substituting Equations (15) to (18) for $I_{C1}$, $I_{C2}$, $I_{C3}$, and $I_{C4}$ in Equation (19).

$$I_S\exp\left(\frac{V_{BE}}{V_T}\right)=\frac{\alpha_F I_0}{4\cosh\left(\frac{V_1}{2V_T}\right)\cosh\left(\frac{V_2}{2V_T}\right)\exp\left(\frac{V_2}{2V_T}\right)} \quad (20)$$

Consequently, a difference current of $\Delta I$ between $I_L$ and $I_R$ is represented by a following equation (21).

$$\begin{aligned}\Delta I &= I_L-I_R=(I_{C1}+I_{C4})-(I_{C2}+I_{C3}) \quad (21)\\ &= 4I_S\exp\left(\frac{V_{BE}}{V_T}\right)\sinh\left(\frac{V_1}{2V_T}\right)\sinh\left(\frac{V_2}{2V_T}\right)\exp\left(\frac{V_2}{2V_T}\right)\end{aligned}$$

A following equation (22) is given by substituting Equation (20) for $I_S\exp(V_{BE})/(V_T)$ in Equation (21).

$$\Delta I=\alpha_F I_0\tan h\{(V_1)/(2V_t)\}\tan h\{(V_2)/(2V_2)\} \quad (22)$$

Inasmuch as $\alpha_F$ is approximately equal to a "1", $\alpha_F$ is approximately equal to $\alpha_F^2$. Consequently, by comparing Equations (13) and (22), it will be understood that the $\Delta I$ is approximately equal to the $\Delta I'$.

Figure 3:
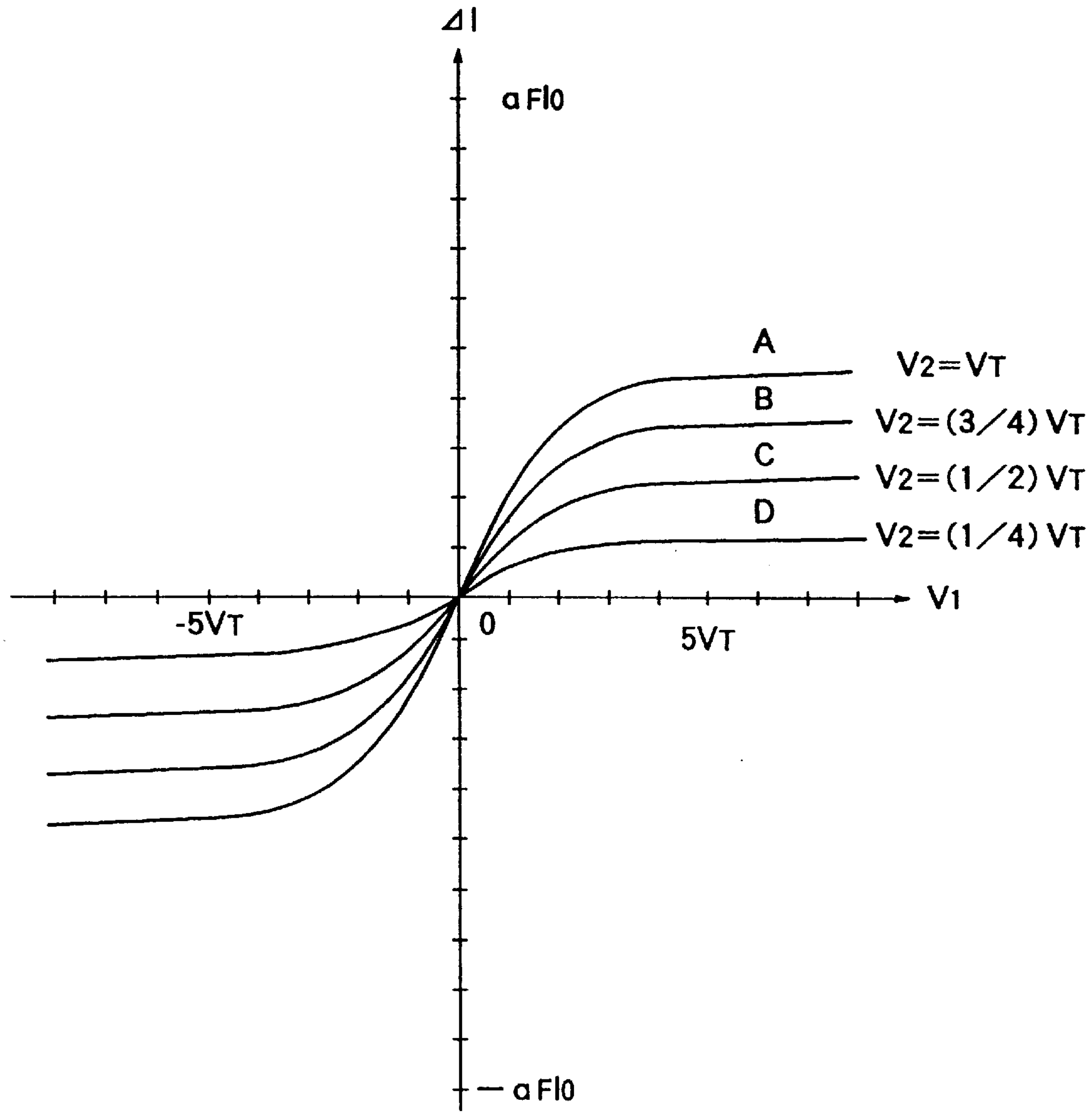
FIG. 3 is a graph for use in describing operation of the analog multiplier illustrated in FIG. 2.

Referring to FIG. 3, characteristic curves A, B, C, and D represent the characteristic of relation between input signals and output signals in the analog multiplier of this invention. The characteristic illustrated in FIG. 2 is substantially equal to the characteristic of the conventional analog multiplier illustrated in FIG. 1.

Figure 4:
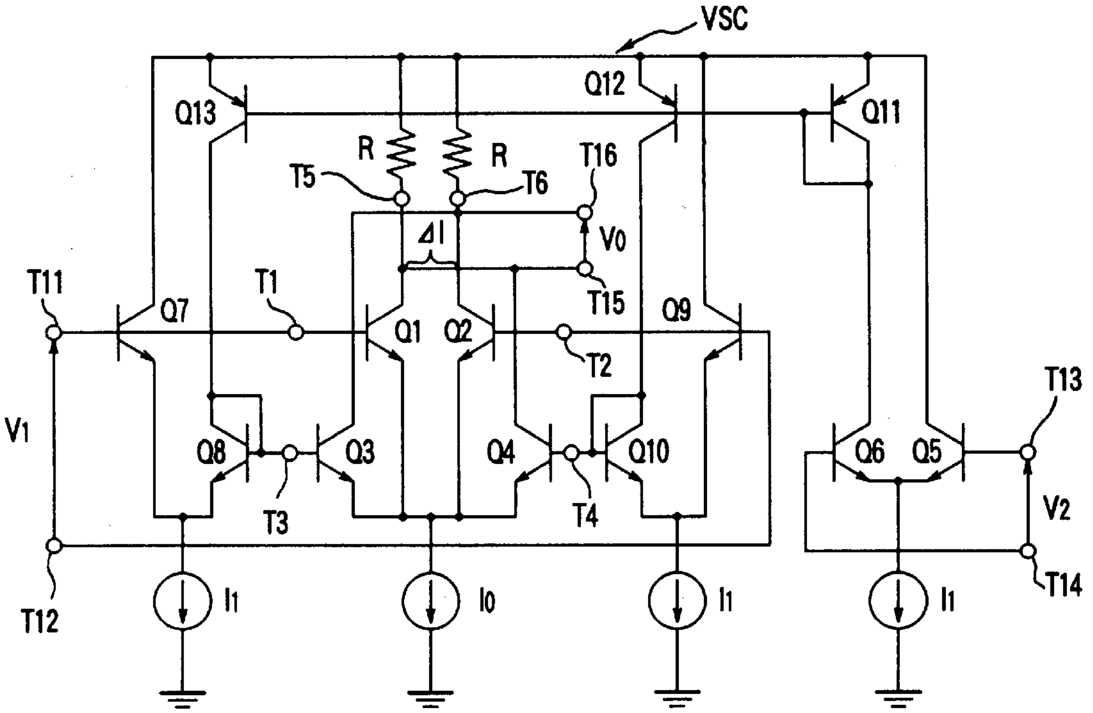
FIG. 4 is a circuit diagram of an analog multiplier according to a second embodiment of this invention.

Referring to FIG. 4, the description will proceed to an analog multiplier according to a second embodiment of this invention. Similar parts are designated by like reference numerals.

The analog multiplier comprises the transistors Q1 to Q4, the current source $I_0$, and a voltage supplying circuit VSC. The voltage supplying circuit VSC comprises transistors Q5 to Q13, first and second resistors R, and first through third current sources $I_1$ each of which has a current of $I_1$. $I_1$ is equal to (½)$I_0$.

The input terminal T1 is connected to a first input terminal T11. The input terminal T2 is connected to a second input terminal T12. The transistor Q5 has a base electrode connected to a third input terminal T13. The transistor Q6 has a base electrode connected to a fourth input terminal T14.

The analog multiplier is supplied with a first input analog signal having a voltage of $V_1$ and a second input analog signal having a voltage of $V_2$. More specifically, the first and the second input terminals T11 and T12 are supplied with the voltage of $V_1$. The third and the fourth input terminals T13 and T14 are supplied with the voltage of $V_2$.

A collector electrode of the transistor Q5 is connected to collector electrodes of the transistors Q7 and Q9 and to emitter electrodes of the transistors Q11, Q12, and Q13. Emitter electrodes of the transistors Q5 and Q6 are connected to the first current source $I_1$. Emitter electrodes of the transistors Q7 and Q8 are connected to the second current source $I_1$. Emitter electrodes of the transistors Q9 and Q10 are connected to the third current source $I_1$. A collector electrode of the transistor Q6 is connected to a collector electrode of the transistor Q11. A base electrode of the transistor Q7 is connected to the input terminal T1 and the first input terminal T11. The transistor Q8 has a base electrode connected to the input terminal T3 and a collector electrode connected to a collector electrode of the transistor Q13 and the input terminal T3.

The transistor Q9 has a base electrode connected to the input terminal T2 and the second input terminal T12. The transistor Q10 has a base electrode connected to the input terminal T4 and a collector electrode connected to a collector electrode of the transistor Q12 and the input terminal T4. The transistor Q11 has a base electrode connected to a base electrode of the transistor Q13 and to the collector electrode of the transistor Q6.

The output terminal T5 is connected to a node of the emitter electrodes of the transistors Q12 and Q13 through the first resistor R. The output terminal T6 is connected to a node of the emitter electrodes of the transistors Q12 and Q13 through the second resistor R. A first output terminal T15 is connected to the output terminal T1. A second output terminal T16 is connected to the output terminal T6.

The voltage supplying circuit VSC receives the voltages of $V_1$ and $V_2$ and produces the voltages of (½)$V_1$, (−½)$V_1$, {(½)$V_1$−$V_2$}, and {(−½)$V_1$−$V_2$} to supply the voltages of (½)$V_1$, (−½)$V_1$, {(½)$V_1$−$V_2$}, and {(−½)$V_1$−$V_2$} to the input terminals T1, T2, T3, and T4, respectively. When the input terminals T1, T2, T3, and T4 are supplied with the voltages of (½)$V_1$, (−½)$V_1$, {(½)$V_1$−$V_2$}, and {(−½)$V_1$−$V_2$}, the output terminals T5 and T6 are supplied with the output currents of $I_L$ and $I_R$, respectively. Also, an output voltage of $V_0$ occurs between the first and the second output terminals T15 and T16. The voltages of $V_0$ is proportional to $\Delta I$, namely, ($V_1$−$V_2$).

What is claimed is:

1. An analog multiplier for receiving a primary input analog signal having a primary voltage of $V_1$ and a secondary input analog signal having a secondary voltage of $V_2$ to produce a primary output current and a secondary output current at a first output terminal and a second output terminal, respectively, which collectively constitute an output based on a product of said primary and secondary voltages, said analog multiplier comprising:

a primary pair of first and second transistors, said first transistor having a base electrode connected to a first input terminal and a collector electrode connected to said first output terminal supplied with said primary output current, said second transistor having a base electrode connected to a second input terminal and a collector electrode connected to said second output terminal supplied with said secondary output current;

a secondary pair of third and fourth transistors, said third transistor having a base electrode connected to a third input terminal and a collector electrode connected to said second output terminal, said fourth transistor having a base electrode connected to a fourth input terminal and a collector electrode connected to said first output terminal;

a first current source connected to emitter electrodes of said first through said fourth transistors; and a voltage supplying circuit connected to said first through said fourth input terminals for producing, in response to said primary and said secondary voltages of $V_1$ and $V_2$, a first voltage of (½)$V_1$, a second voltage of (−½)$V_1$, a third voltage of $\{(\frac{1}{2})V_1-V_2\}$, and a fourth voltage of $\{(-\frac{1}{2})V_1-V_2\}$ to supply said first through fourth voltages of $(\frac{1}{2})V_1$, $(-\frac{1}{2})V_1$, $\{(\frac{1}{2})V_1-V_2\}$, and $\{(-\frac{1}{2})V_1-V_2\}$ to said first through fourth input terminals, respectively;

the output of the analog multiplier being present between the first and second output terminals.

2. The analog multiplier as claimed in claim 1, wherein said emitter electrodes of said first through said fourth transistors are directly connected to each other and to said first current source.

3. The analog multiplier as claimed in claim 2, wherein said voltage supplying circuit is supplied with said primary voltage ($V_1$) between first and second circuit input terminals and said secondary voltage ($V_2$) between third and fourth circuit input terminals to produce said first through said fourth voltages and comprises:

a plurality of transistors connected to said first through said fourth circuit input terminals and to said first through said fourth input terminals and supplied with a constant current source to supply said first through said fourth voltages to said first through said fourth input terminals, respectively; and first and second resistors connected to said plurality of transistors and to said first and second output terminals, respectively, to produce said output voltage between said first and said second output terminals in response to a difference current between said primary and said secondary output currents.

4. The analog multiplier as claimed in claim 3, wherein:

said plurality of transistors comprise fifth through thirteenth transistors, each of which has a base electrode, an emitter electrode, and a collector electrode, the eighth, the tenth, and the eleventh transistors are diode connected;

said third and said fourth input terminals are connected to the base electrode of said eighth and said tenth transistors, respectively;

said first through said fourth circuit input terminals are connected to the base electrodes of the seventh, the ninth, the fifth, and the sixth transistors, respectively;

the base electrodes of said eleventh through said thirteenth transistors are commonly connected;

the collector electrodes of said fifth and said sixth transistors are connected to the emitter and the collector electrodes of said eleventh transistor, respectively, the collector electrodes of said seventh and said eighth transistors are connected to the emitter and the collector electrodes of said thirteenth transistor respectively, the collector electrodes of said ninth and said tenth transistors are connected to the emitter and the collector electrodes of the twelfth transistor, respectively;

the emitter electrodes of said fifth and said sixth transistors are connected to a second current source, the emitter electrodes of said seventh and said eighth transistors are connected to a second current source, the emitter electrodes of said ninth and said tenth transistors are connected to a fourth current source, and said second through said fourth current sources constitutes said constant current source;

the emitter electrodes of said tenth through said thirteenth transistors are connected to a common node, said first and said second resistors are connected to said common node and to said first and said second output terminals, respectively.

5. The analog multiplier as claimed in claim 4, wherein each current of said second to said fourth current sources are equal to a half of a current of said first current source connected to the emitter electrodes of said first through said fourth transistors.

* * * * *